(12) United States Patent
Li

(10) Patent No.: US 7,894,778 B2
(45) Date of Patent: Feb. 22, 2011

(54) LO GENERATOR TO REJECT UNWANTED SIDEBAND

(75) Inventor: Qiang (Tom) Li, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 874 days.

(21) Appl. No.: 11/478,667

(22) Filed: Jun. 30, 2006

(65) Prior Publication Data
US 2008/0003968 A1 Jan. 3, 2008

(51) Int. Cl.
H04B 1/40 (2006.01)

(52) U.S. Cl. .................. 455/76; 455/85; 455/552.1; 455/168.1; 455/87; 455/146; 455/176.1; 455/178.1; 455/196.1; 455/197; 455/207; 455/255; 455/264; 455/283; 455/302; 455/315

(58) Field of Classification Search .............. 455/76, 455/315–319, 207–209, 283–285, 85–87, 455/552.1, 146, 168.1, 176.1, 178.1, 196.1, 455/197.1, 255, 264–265, 302
See application file for complete search history.

(56) References Cited

U.S. PATENT DOCUMENTS

| | | | | |
|---|---|---|---|---|
| 4,725,786 | A * | 2/1988 | Papaieck | 327/105 |
| 6,404,293 | B1 | 6/2002 | Darabi et al. | |
| 6,640,091 | B1 * | 10/2003 | Shiraishi | 455/118 |
| 6,687,320 | B1 * | 2/2004 | Chiu et al. | 375/376 |
| 6,970,689 | B2 | 11/2005 | Khorram | |
| 7,003,274 | B1 * | 2/2006 | Olip | 455/260 |
| 7,031,668 | B2 | 4/2006 | Darabi et al. | |
| 7,071,790 | B2 | 7/2006 | Darabi | |
| 7,154,346 | B2 | 12/2006 | Jaffe | |
| 7,203,475 | B2 * | 4/2007 | Anand | 455/318 |
| 2002/0021762 | A1 * | 2/2002 | Takagi | 375/261 |
| 2005/0282514 | A1 * | 12/2005 | Kang et al. | 455/313 |
| 2006/0019700 | A1 * | 1/2006 | Seo et al. | 455/553.1 |
| 2007/0135073 | A1 * | 6/2007 | Smentek et al. | 455/318 |

OTHER PUBLICATIONS

"RFIC and MMIC Design and Technology", ISBN0852967861, (2001).
"The Design of CMOS Radio-Frequency Integrated Circuits", ISBN0521639220, (1998).
"RF Design Guide: Systems, Circuits and Equations", ISBN0890067546, (1995).
"Microwave and Wireless Synthesizers: Theory and Design", ISBN0471520195, (1997).

* cited by examiner

*Primary Examiner*—Edward Urban
*Assistant Examiner*—Ganiyu Hanidu
(74) *Attorney, Agent, or Firm*—Brake Hughes Bellermann LLP

(57) ABSTRACT

According to an example embodiment, an apparatus is provided in a wireless transceiver. The apparatus may include a circuit configured to generate a first frequency signal (e.g., a VCO signal). A local oscillator (LO) generator may be provided that includes a frequency divider to divide the first frequency signal, and an image rejection mixer configured to mix the first frequency signal with an output of the frequency divider to generate an LO signal. In this manner, the LO generator may generate a desired LO signal while substantially rejecting or suppressing an unwanted sideband or image signal, according to an example embodiment.

17 Claims, 7 Drawing Sheets

$W_1 = f_{VCO}$ (VCO output signal)
$W_2 = F_{div}$ (frequency divided VCO output signal)
Desired LO Signal: $Sin(W_1+W_2)$
LO Signal Image: $Sin(W_1-W_2)$ $Sin(W_1 t) Cos(W_2 t) = 1/2[Sin(W_1+W_2)t + Sin(W_1-W_2)t]$  (Eqn. 1)
$Cos(W_1 t) Sin(W_2 t) = 1/2[Sin(W_1+W_2)t - Sin(W_1-W_2)t]$  (Eqn. 2)

Add Eqn. 1 and Eqn. 2 to obtain desired LO signal only (rejecting LO image)
$Sin(W_1 t) Cos(W_2 t) + Cos(W_1 t) Sin(W_2 t) = Sin(W_1+W_2)t$   (desired LO signal only)

LO GENERATOR TO REJECT UNWANTED SIDEBAND

BACKGROUND

Wireless transceivers are used in a wide variety of wireless systems. A wireless transceiver may typically include a wireless receiver for receiving and demodulating signals, and a transmitter for modulating signals for transmission. Wireless transceivers and other communications circuits often include a local oscillator (LO) generator to generate a local oscillator. The local oscillator may be used, for example, in a mixer to down-convert a received radio frequency (RF) signal to an intermediate frequency (IF), and may be used in a mixer to up-convert a signal to an RF signal for transmission. An LO generator may be used in other circuits as well. In some cases, it may be challenging for an LO generator to provide one or more LO signals to provide proper performance for the transceiver.

SUMMARY

Various embodiments are disclosed relating to wireless systems, and also relating to a local oscillator (LO) generator to reject an unwanted sideband.

According to an example embodiment, an apparatus is provided in a wireless transceiver. The apparatus may include a circuit configured to generate a first frequency signal (e.g., a VCO signal). A local oscillator (LO) generator may be provided that includes a frequency divider to divide the first frequency signal, and an image rejection mixer configured to mix the first frequency signal with an output of the frequency divider to generate an LO signal. In this manner, the LO generator may generate a desired LO signal while substantially rejecting or suppressing an unwanted sideband or image signal, according to an example embodiment.

According to another example embodiment, a wireless transceiver is provided that may include a multiband wireless transceiver. The multiband wireless transceiver may be configured to transmit and receive signals within a first frequency band and within a second frequency band. The multiband wireless transceiver may also include a local oscillator (LO) generator to generate LO signals. The LO generator may include an image rejection mixer configured to generate the LO signal.

In yet another example embodiment, a method is provided. In an example embodiment, the method may include receiving a first frequency signal, dividing the first frequency signal to produce a second frequency signal, and mixing the first frequency signal with the second frequency signal at an image rejection mixer to generate a local oscillator (LO) signal while substantially rejecting an LO image or sideband.

DETAILED DESCRIPTION

Figure 1:
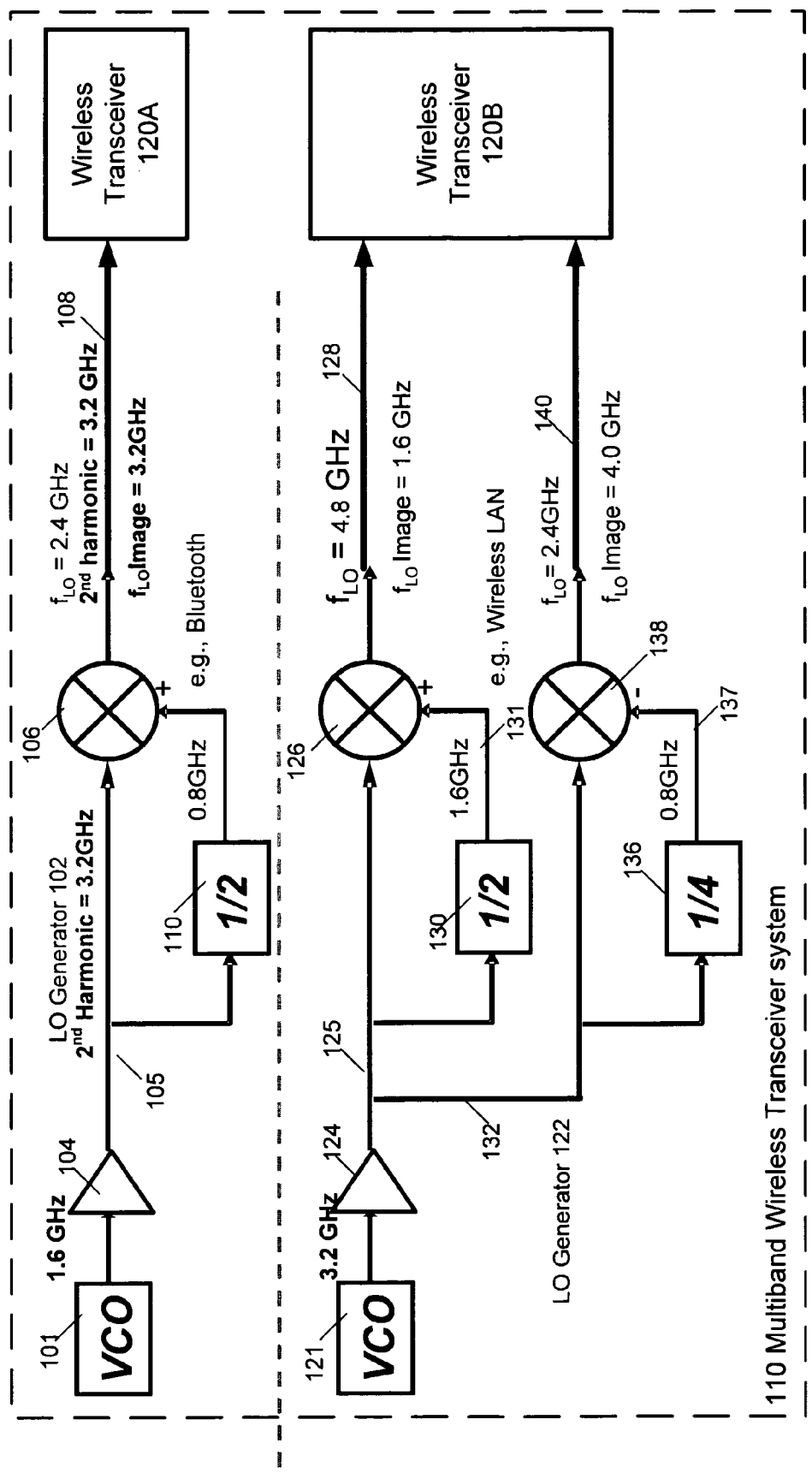
FIG. 1 is a block diagram of a wireless transceiver system according to an example embodiment.

FIG. 1 is a block diagram of a wireless transceiver system according to an example embodiment. In this example embodiment, a multiband wireless transceiver system 110 is illustrated in FIG. 1, although the various embodiments and teachings herein may be applied to either a single band or multi-band transceiver systems. Multi-band wireless transceiver system 110 may, for example, transmit and receive signals on multiple frequency bands, which may be for one standard, or for different standards, etc. For example, different standards may include, Blue Tooth (BT), one or more Wi-Fi standards, such as IEEE 802.11a, 802.11b, 802.11g, or other 802.11 standard, Wi-Max (e.g., 802.16), cellular, GSM (Global System for Mobile communication), etc.

Transceiver system 110 may include one or more local oscillator (LO) generators to generate a LO signal. For example, an LO generator 102 may generate an LO signal for use by a Bluetooth (BT) wireless transceiver 120A, while LO generator 122 may generate LO signals for use by one or more Wi-Fi or 802.11 wireless transceivers. The various frequencies described in the examples below are merely example frequencies used to illustrate operation of an example system, but any frequency may be used.

LO generator 102 will now be briefly described. In an example embodiment, a voltage controlled oscillator (VCO) 101 or other circuit may generate a VCO signal at a frequency of, for example, $f_{VCO}=1.6$ GHz. The VCO signal may be input to LO generator 102, which may include, for example, a buffer 104, a frequency divider 110 and a LO mixer 106. The VCO signal may be buffered by buffer 104 and then output onto line 105. The VCO signal may be frequency divided by frequency divider 110, which may, for example, divide the VCO signal ($f_{VCO}=1.6$ GHz) by 2 to output a frequency divided signal at 0.8 GHz, according to this example. LO mixer 106 may mix the VCO signal at 1.6 GHz with the frequency divided signal at 0.8 GHz to generate an LO signal at $f_{LO}=2.4$ GHz. Mixer 106 may also produce a second harmonic at 3.2 GHz and LO image at 3.2 GHz, for example.

The output from mixer 106 may be coupled to a wireless transceiver 120A, which may be a Bluetooth or other wireless transceiver, for example, to transmit and receive wireless signals. Wireless transceiver 120A may include, for example, a transmit mixer to mix a signal, such as an intermediate frequency (IF) signal or other signal, with the LO signal to generate an RF signal as part of a transmitter. Wireless transceiver 120A may also include, for example, a receive mixer to down-convert a received RF signal to produce an IF signal for further processing at the receiver. The transceiver 102A may include a variety of other circuits, such as filters, amplifiers, a digital signal processor, and other logic to transmit and receive wireless signals, to down convert IF signals to baseband, to up-convert signals, to perform signal amplification and filtering on signals, a digital-to-analog converter and an analog-to-digital converter, etc. LO generator 102 and wireless transceiver 120A may be provided for Bluetooth or other standard or frequency band, for example.

The operation of LO generator 122 will now be briefly described. LO generator 122 may provide LO signals for wireless transceiver 120B. A VCO 121 may generate a VCO signal at, for example, $F_{VCO}=3.2$ GHz. The VCO signal output by VCO 121 may be buffered by buffer 124, and then output onto line 125. The VCO signal may be input to LO mixer 126. The VCO signal on line 125 may also be frequency divided by frequency divider 130, which may divide the VCO signal by 2 to generate a 1.6 GHz signal output onto line 131, for example. Mixer 126 may mix the two input signals to generate a LO signal at $f_{LO}$=4.8 GHz onto line 128, for example (e.g., based on the sum of the two input signals). Mixer 126 may also produce an LO image at 1.6 GHz (e.g., based on the difference of the two input frequency signals to mixer 126). The LO signal and LO image may be input to wireless transceiver 120B via line 128, where receive and/or transmit mixers may be used to down-convert and up convert signals using the LO signal. However, prior to frequency conversion, a filter, such as an R-C filter or an L-C (inductor-capacitor) tank filter may be used to filter the LO image (e.g., at 1.6 GHz) from the LO signal (e.g., at 4.8 GHz), e.g., to sufficiently suppress or reject the LO image. The 4.8 GHz LO signal may be input to or used in an 802.11a WLAN receiver, for example (which may be included within wireless transceiver 120B, for example).

LO generator 122 may also include an additional frequency divider 136 and a LO mixer 138. The VCO signal at 3.2 GHz may be output onto line 132, and then input to LO mixer 138 and frequency divider 136. Frequency divider 136 may divide the VCO signal by 4, for example, to output a frequency divided signal at 0.8 GHz onto line 137, for example. LO mixer 138 may mix the VCO signal at 3.2 GHz with the frequency divided signal at 0.8 GHz received via line 137, and generate a LO signal at $f_{LO}$=2.4 GHz, based on the difference in frequency between the two inputs to mixer 138. LO mixer 138 may also generate an LO image at 4.0 GHz, e.g., based on a sum in frequency of the two inputs to LO mixer 138. The LO signal at 2.4 GHz and LO image at 4.0 GHz may be input to wireless transceiver, such as an 802.11b transceiver, which may be provided within wireless transceiver 120B. The LO signal at 2.4 GHz and LO image at 4.0 GHz may be input to wireless transceiver 120B via line 128, where receive and/or transmit mixers may be used to down-convert and up convert signals using the LO signal. However, in an example embodiment, prior to frequency conversion, a filter, such as an L-C tank filter or other filter, may be used to sufficiently filter or separate or reject the LO image (e.g., at 4.0 GHz) from the LO signal (e.g., at 2.4 GHz).

In an example embodiment, wireless transceiver may be a multiband wireless transceiver to transmit and receive on multiple bands, such as frequency bands for both 802.11a and 802.b, as examples. These are merely examples and any frequency bands may be used. Wireless transceiver 120B may include one or more receive mixers to down-convert a received RF signal to an IF signal based on the LO signal, and one or more transmit mixers to up-convert a signal to RF, e.g., based on the LO signal. Wireless transceiver 120B may include other circuits typically provided in a transceiver to transmit and receive signals, such as amplifiers, filters, A/D converters, D/A converters, digital signal processors to process signals, etc.

However, according to an example embodiment, an issue may arise in multiband or multi-standard wireless systems, and possibly other systems, due to potential interference between LO signals, VCO signals, and other LO generated signals, e.g., as between the transceiver systems of the different bands or standards. For example, as shown in FIG. 1, the signal output from VCO 101 is at 1.6 GHz (e.g., part of the Bluetooth wireless transmission system), while the signal output onto line 131 from frequency divider 130 (e.g., part of the 802.11 wireless transmission system) is also at 1.6 GHz, and therefore, may interfere with each other. Likewise, VCO signal output by VCO 121 is at 3.2 GHz, while the LO $2^{nd}$ harmonic output by LO mixer 106 and buffer 104 is at 3.2 GHz, and thus, these two signals may also interfere with each other, particularly if the various circuits for multiband wireless transceiver system is provided on a common substrate or share some common electrical components, for example.

Figure 2:
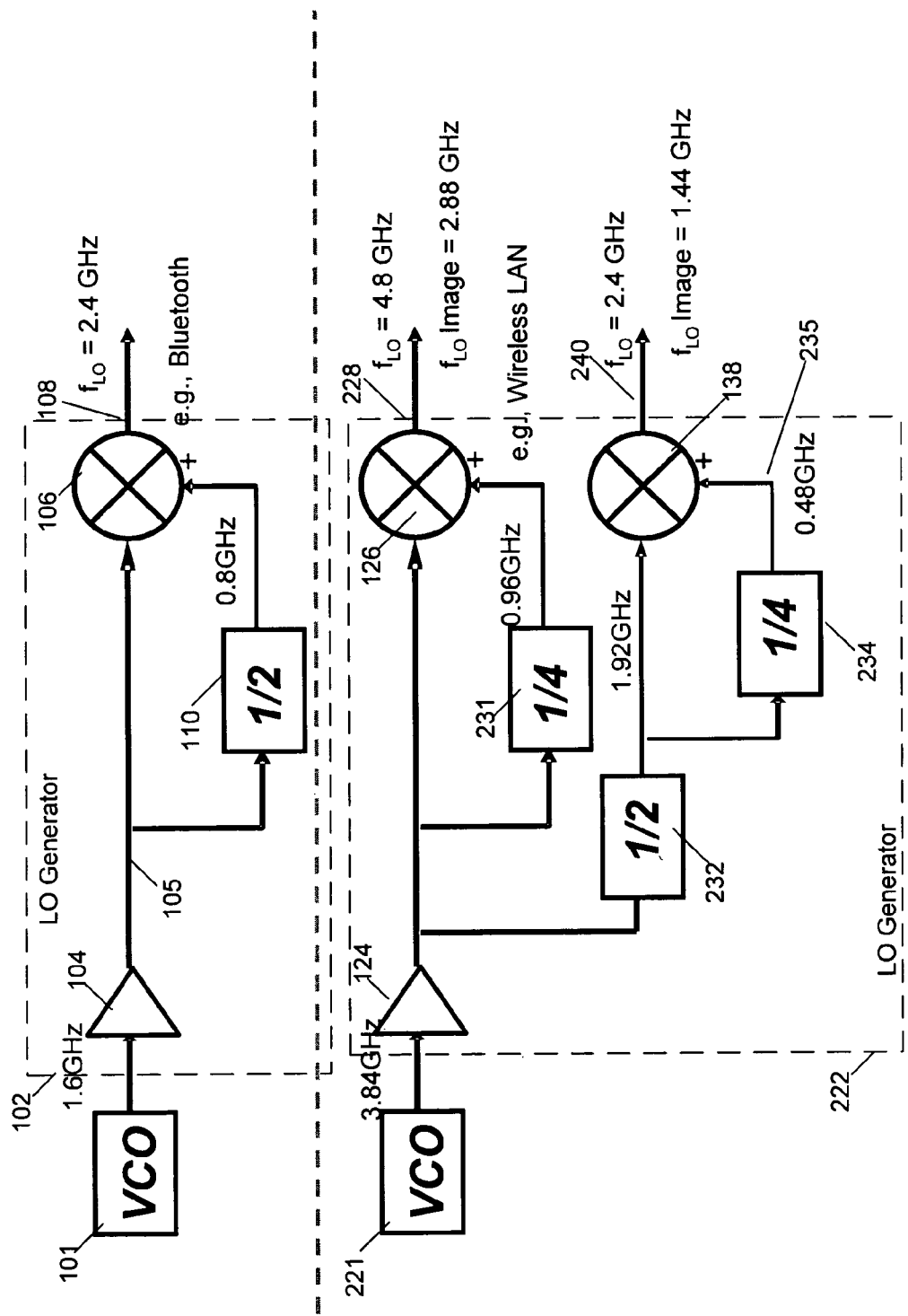
FIG. 2 is a block diagram illustrating a portion of a wireless transceiver system according to another example embodiment.

FIG. 2 is a block diagram illustrating a portion of a wireless transceiver system according to another example embodiment. In this example embodiment, LO generator 102 may be the same or similar to the LO generator 102 in FIG. 1, e.g., outputting a LO signal at 2.4 GHz, such as for a Bluetooth or other wireless transceiver. However, in FIG. 2, a number of modifications or changes have been performed, as compared to FIG. 1, in order to eliminate or at least decrease signal or frequency interference between the different bands of the transceiver system.

In FIG. 2, LO generator 222 has replaced by LO generator 222 in FIG. 2. The differences between LO generator 122 and LO generator 222 will be briefly described, with the remainder of the system shown in FIG. 2, being the same or substantially the same.

In FIG. 2, VCO 221 replaces VCO 121 (FIG. 1), and outputs a VCO signal at 3.84 GHz (instead of 3.2 GHz in FIG. 1). Also, in FIG. 2, LO generator 222 replaces LO generator 122 (FIG. 1). Frequency divider 130 (½) has been replaced with frequency divider 231 (¼) to divide the VCO signal by 4 and generate a frequency divided signal of 0.96 GHz. Therefore, in FIG. 2, LO mixer 126 in FIG. 2 may output a LO signal at 4.8 GHz (based on the frequency sum of the inputs) and an LO image at 2.88 GHz (based on a frequency difference of inputs), according to this example.

Similarly, within LO generator 222, frequency dividers 232 (½) and 234 (¼) replace the frequency divider 136 in FIG. 1. Thus, frequency divider 232 may output a signal at 1.92 GHz, while frequency divider 234 may output a signal onto line 235 at 0.48 GHz. LO mixer 138 in FIG. 2 may therefore, mix these two inputs and output a LO signal at 2.4 GHz, and an LO image at 1.44 GHz.

Therefore, the LO generator 222 outputs LO signals at the same LO frequencies of 4.8 GHz and 2.4 GHz, which is the same output LO frequencies as FIG. 1. However, the LO image signals generated by LO generator 222 may be at different frequencies, e.g., due to different frequency for VCO signals and different values for frequency dividers. Therefore, in the example shown in FIG. 2, LO mixer 126 in FIG. 2 may output an LO signal at 4.8 GHz and an LO image at 2.88 MHz, while LO mixer 138 in FIG. 2 may output an LO signal at 2.4 GHz and an LO image at 1.44 GHz.

While the interference between signals of the multiband transceiver has been decreased in the LO generators shown in FIG. 2 (as compared to FIG. 1 for example), the frequencies of the LO image signals output in this example of FIG. 2 are now significantly closer to the frequencies of the LO signals. Thus, because the frequency LO images are closer to the frequency of the LO signals, it may now typically be more challenging to sufficiently filter or reject the LO image while passing the LO signal for the LO generator 222. For example, 2.88 GHz is relatively close to LO signal at 4.8 GHz, and LO image of 1.44 GHz is relatively close to LO signal at 2.4 GHz (at least closer than the signals for FIG. 1).

If the LO image is not sufficiently rejected or filtered from the LO signal, this may create some problems or performance issues for a wireless transceiver, for example. For example, for the transmitter, if the LO image is not sufficiently filtered or suppressed, then the transmitter may transmit a signal that may violate a transmit spectral mask requirements. For the receiver, if the LO image is not suppressed or filtered but is mixed at the receive mixer, a blocker signal may in some cases be mixed with the LO image to create an unwanted blocker signal at IF (e.g., having the same frequency as the intermediate frequency or IF). Because the unwanted blocker signal, after mixing, is at the same IF frequency as the desired signal, the blocker signal may not be separated from the desired signal using a filter (since they are tat the same frequency). For example, $f_{RF}-f_{LO}=f_{IF}$ (Desired signal); also, for the blocker, $f_{BLOCKER}-f_{LOimage}=f_{IFunwanted\ blocker}$. Thus, inadequate filtering or suppression of the LO image in some cases may allow the generation of an unwanted blocker signal at the IF frequency, which is the same frequency as the desired IF signal. (e.g., where $f_{IF}=f_{IFunwanted\ blocker}$). This is just an example, and the various embodiments are not limited thereto According to an example embodiment, in order to sufficiently filter or suppress the LO image, a relatively high Q filter may be used to provide a sufficiently sharp filter. However, this technique may be relatively expensive, e.g., in some embodiments may require a relatively large inductor or possibly other components that may be expensive or take up significant area or silicon real estate, for example. In another embodiment (e.g., in addition to a relatively high Q filter or as an alternative to a relatively high Q filter), an LO generator may be provided in an example embodiment that may include an image rejection mixer to reject an unwanted image or sideband, as described in greater detail below.

Figure 3:
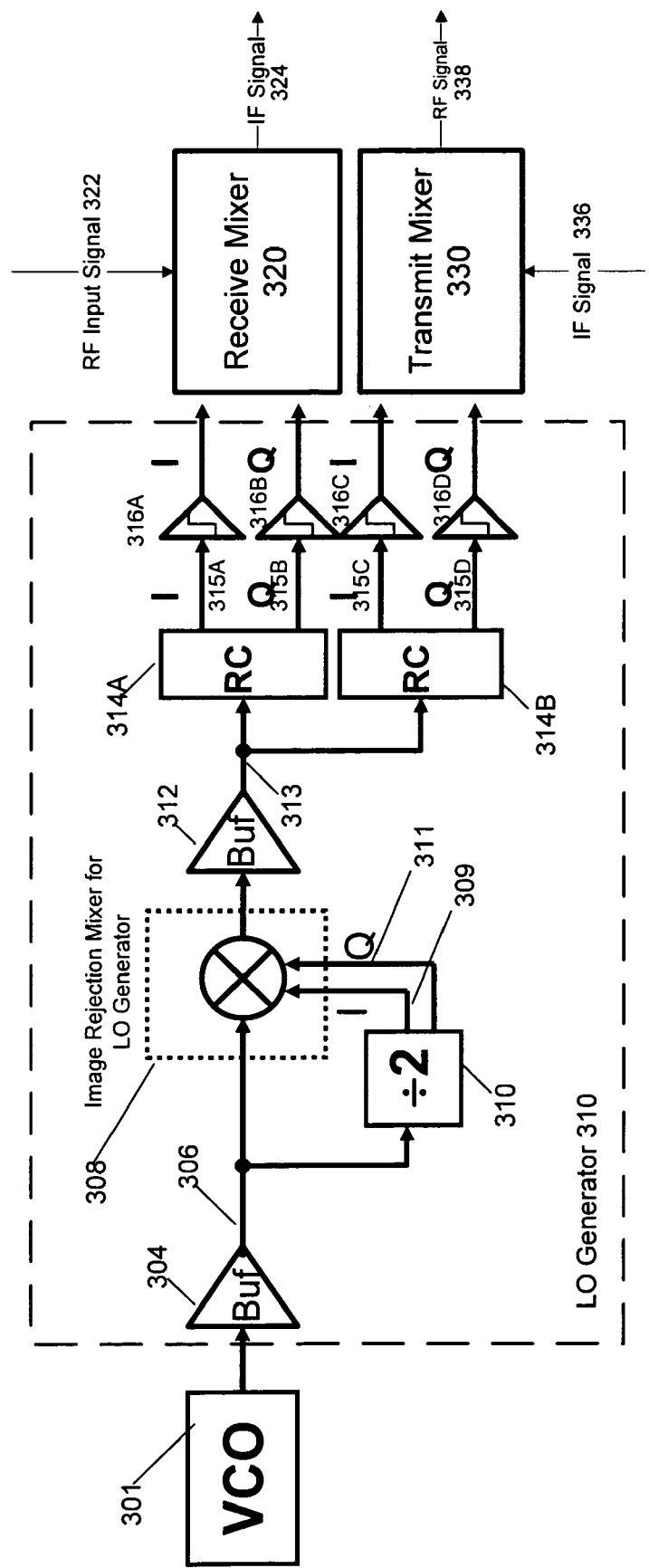
FIG. 3 is a block diagram illustrating a portion of a wireless transceiver system according to another example embodiment.

FIG. 3 is a block diagram illustrating a portion of a wireless transceiver system according to another example embodiment. Wireless transceiver system 300 may include a VCO 301, a LO generator 310, a receive mixer 320 and a transmit mixer 330. The wireless transceiver system 300 may include a number of other circuits or blocks not shown, such as filters, amplifiers, digital signal processors, etc., to assist in transmitting and receiving signals.

Referring to FIG. 3, VCO 301 may generate and output a VCO signal. Buffer 304 may buffer and output the VCO signal onto line 306. The VCO signal provided on line 306 may be frequency divided by frequency divider 310 (e.g., ½ frequency divider). Frequency divider 310 may, for example, output in-phase (I) and quadrature phase (Q) frequency divided signals via lines 309 and 311, respectively.

Referring to FIG. 3, according to an example embodiment, an image rejection mixer 308 may be used as a mixer for LO generator 310. For example, image rejection mixer 308 may receive the VCO signal via line 306, and may also receive I and Q frequency divided signals via lines 309 and 312. Image rejection mixer 308 may generate and output an LO signal onto line 313 while substantially suppressing or rejecting an unwanted image or unwanted sideband, for example. The LO signal output onto line 313 may be buffered by buffer 312, and then input to phase shifters 314A and 314B. Phase shifters 314A and 314B may phase-shift a received signal (e.g., to generate a quadrature phase or Q signal) to generate in-phase (I) and quadrature phase (Q) signals, including I and Q receive LO signals on lines 315A and 315B, respectively, and generate I and Q transmit LO signals on lines 315C and 315D, respectively. The receive I and Q LO signals output onto lines 315A, 315B are buffered by buffers 316A and 316B, respectively, and then input to receive mixer 320. Likewise, the I and Q transmit LO signals on lines 315C and 315D are buffered by buffers 316C and 316D, respectively and then input to transit mixer 330.

Receive mixer 320 may be part of a receiver within transceiver system 300, and may down convert a received RF input signal 322 to an IF (intermediate frequency) signal 324 by mixing I and Q receive LO signals with the RF input signal 322. A further down-conversion from IF to baseband frequency may be performed, e.g., by a mixer or in a digital signal processor.

Transmit mixer 330 may be part of a transmitter within wireless transceiver system 300, for example. In an example embodiment, transmit mixer 330 may, for example, mix a received signal, such as IF signal 336, with I and Q transmit LO signals to generate an RF signal 338 for transmission.

Figure 4:
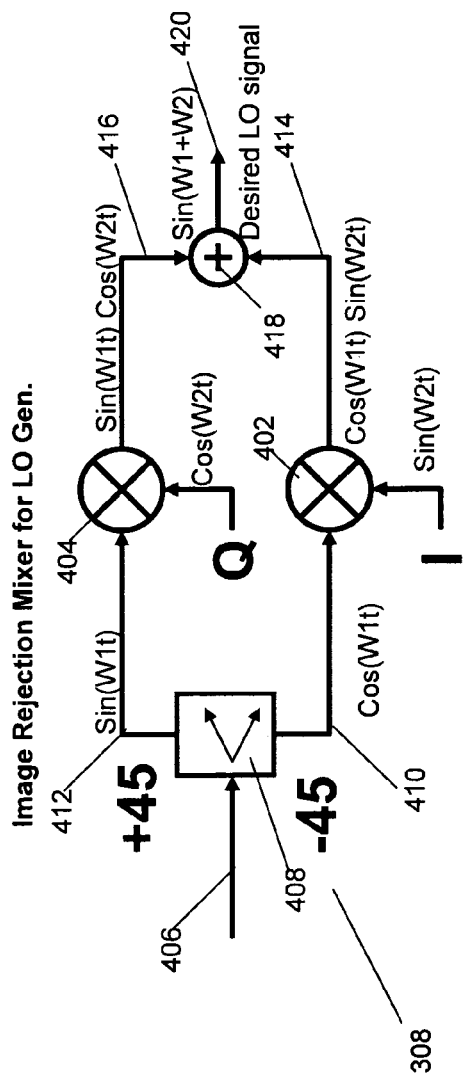
FIG. 4 is a block diagram of an image rejection mixer according to an example embodiment.

FIG. 4 is a block diagram of an image rejection mixer according to an example embodiment. Image rejection mixer 308 may include an in-phase mixer 402 and a quadrature mixer 404. Image rejection mixer 308 may receive, for example, an LO signal at a frequency W1 via line 406. A phase shifter 408 may shift the phase of the LO signal by 90 degrees. An unshifted LO signal may be output onto line 410, while, for example, a phase-shifted LO signal (e.g., shifted by 90 degrees relative to the unshifted LO signal) may be output onto line 412. Thus, the unshifted LO signal is represented as Cos(W1$t$) on line 410, while the shifted LO signal may be represented as Sin(W1$t$) on line 412.

In-phase quadrature mixer 402 may receive as inputs the unshifted LO signal, shown as Cos(W1$t$), and a frequency divided signal, shown as Sin(W2$t$). Thus, the frequency divided signal may be provided at a frequency of W2, for example. Mixer 402 may therefore output the signal or product of the two input signals, shown as Cos(W1$t$)Sin(W2$t$) on line 414. Similarly, quadrature mixer 404 may mix shifted LO signal, Sin(W1$t$), with the frequency divided signal, Cos(W2$t$), to output the signal Sin(W1$t$)Cos(W2$t$) onto line 416.

The desired LO signal is represented, in this example, as Sin(W1+W2), while the LO signal image or unwanted sideband (which is undesirable) may be represented in this example as Sin(W1-W2). The signal, Sin(W1$t$)Cos(W2$t$), output by mixer 404 onto line 416 may be referred to as equation (1). The signal, Cos(W1$t$)Sin(W2$t$), output by mixer 402 onto line 414 may be referred to as equation (2). Combiner 418 may combine or add equation (1) and equation (2), which may substantially cancel or reject the LO signal image (Sin(W1-W2)), and substantially output the LO signal (Sin W1+W2). In this manner, according to an example embodiment, an LO generator may use an image rejection mixer to substantially reject an unwanted sideband or image signal, according to an example embodiment. Therefore, in an example embodiment, one or more of LO mixers 106, 126, and/or 138 (e.g., FIGS. 1, 2) may be image rejection mixers, according to an example embodiment.

Figure 5:
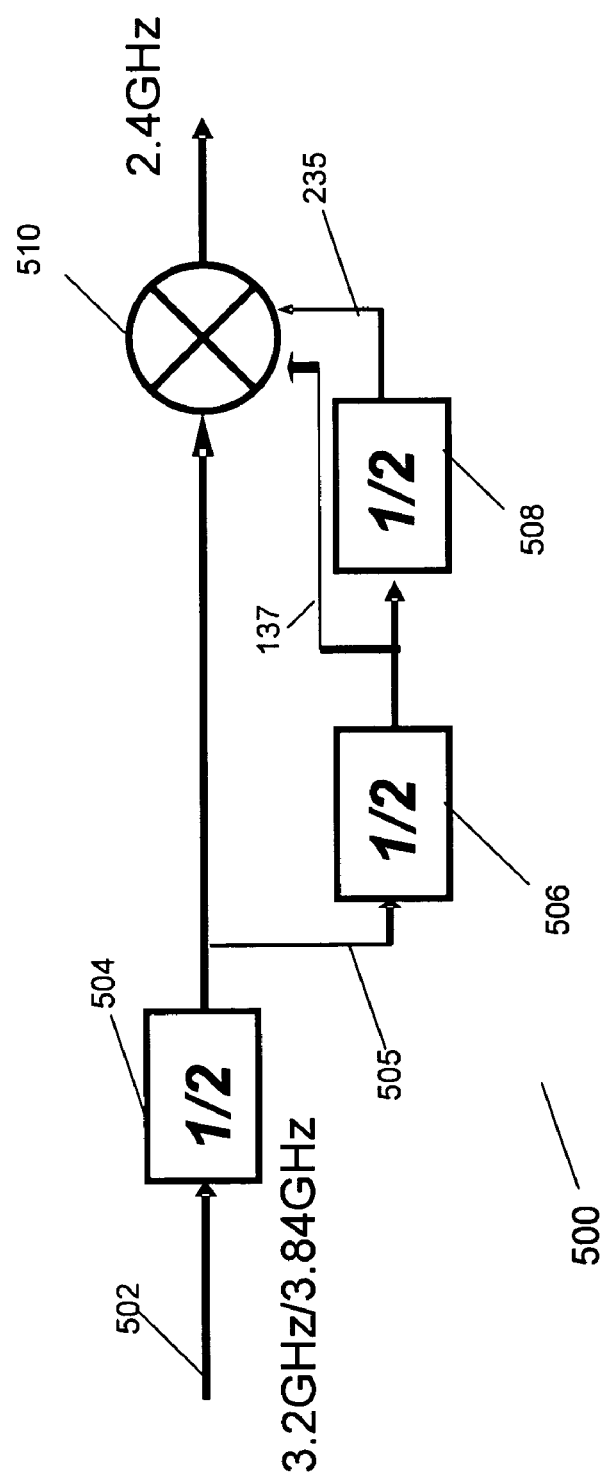
FIG. 5 is a block diagram illustrating a portion of a LO generator according to an example embodiment.

FIG. 5 is a block diagram illustrating a portion of a LO generator according to an example embodiment. The LO generator 500 may include frequency dividers 504, 506 and 508, and an LO mixer 510. In an example embodiment, the LO generator 500 may be programmable or configurable to operate either as shown in FIG. 1, or as shown in FIG. 2. For example, the VCO signal may be either 3.2 GHz or 3.84 GHz, e.g., depending on a mode of operation. Frequency dividers 504 and 506 provide the original divide by 4 output signal on line 137 (shown in FIG. 1), while the addition of frequency divider 508 provides a divide by 8 provided via line 235 in FIG. 2. Both of the frequency divided signals via lines 137 and 235 are input to mixer 510. Mixer 510 may select one of the frequency divided inputs, e.g., based on a selected or programmed or configured mode of operation. Thus, if multiple band transceivers are not operable or not operating (e.g., meaning that frequency or signal interference between transceivers of different bands may not be a problem) the original 3.2 GHz input and frequency divided signal via line 137 may be used at mixer 510 to output the LO signal of 2.4 GHz. On the other hand, if interference may occur to operation of multiple band transceivers, the input VCO signal may be 3.84 GHz, and mixer 510 may select the frequency divided signal on line 235. This may provide a configurable or programmable LO generator, according to an example embodiment.

Figure 6:
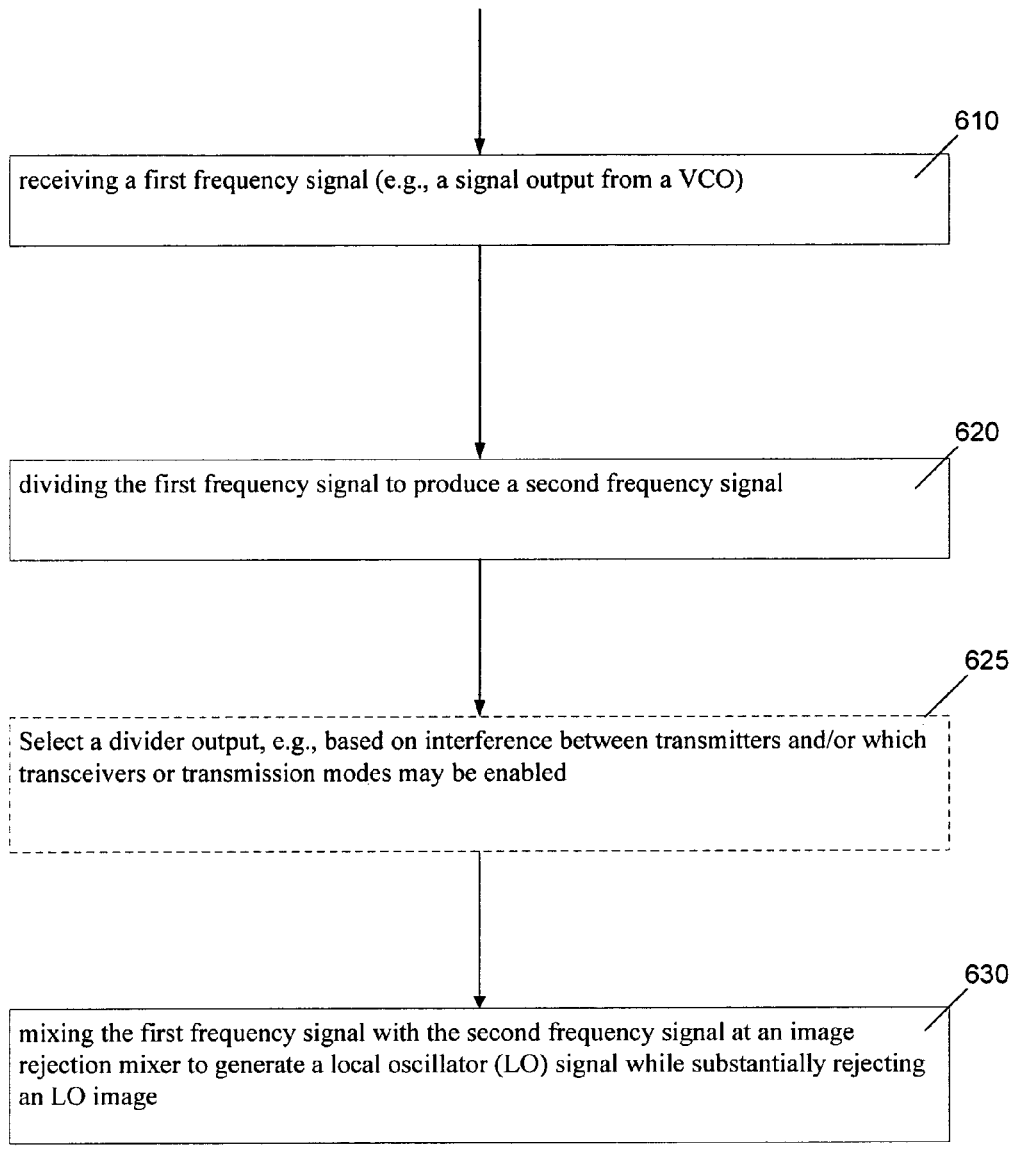
FIG. 6 is a flow chart illustrating operation of a circuit, such as a LO generator, according to an example embodiment.

FIG. 6 is a flow chart illustrating operation of a circuit, such as a LO generator, according to an example embodiment. At 610, a signal at a first frequency may be received, such as a VCO signal output from a VCO or other circuit. At 620, the first frequency signal may be divided to produce a second frequency signal. For example, a VCO signal may be frequency divided by a frequency divider to generate a frequency divided signal, for example.

Operation 625 may be optional. At 625, a divider output (or the second frequency signal) may be selected, e.g., based on presence of interference between transmitters and/or which transceivers or transmission modes may be enabled. For example, if two modes or two transmitters are being operated (e.g., both Bluetooth and WLAN transceivers), then this may cause interference in signals, as noted above. In such case, the divide by 8 frequency output (or higher divider ratio) via line 235 (FIG. 5) from a divider may be selected for mixing. On the other hand, if there is no interference or tolerable interference, such as when the Bluetooth transceiver may be disabled, then the lower divider ratio, e.g., divide by 4 output from the divider via line 137 (FIG. 5) may be selected, since, in this example, this output may provide better image rejection, for example.

At 630, the first frequency signal may be mixed with the second (e.g., frequency divided) signal at an image rejection mixer to general a LO signal while substantially rejecting an unwanted image (e.g., LO image) or unwanted sideband.

Figure 7:
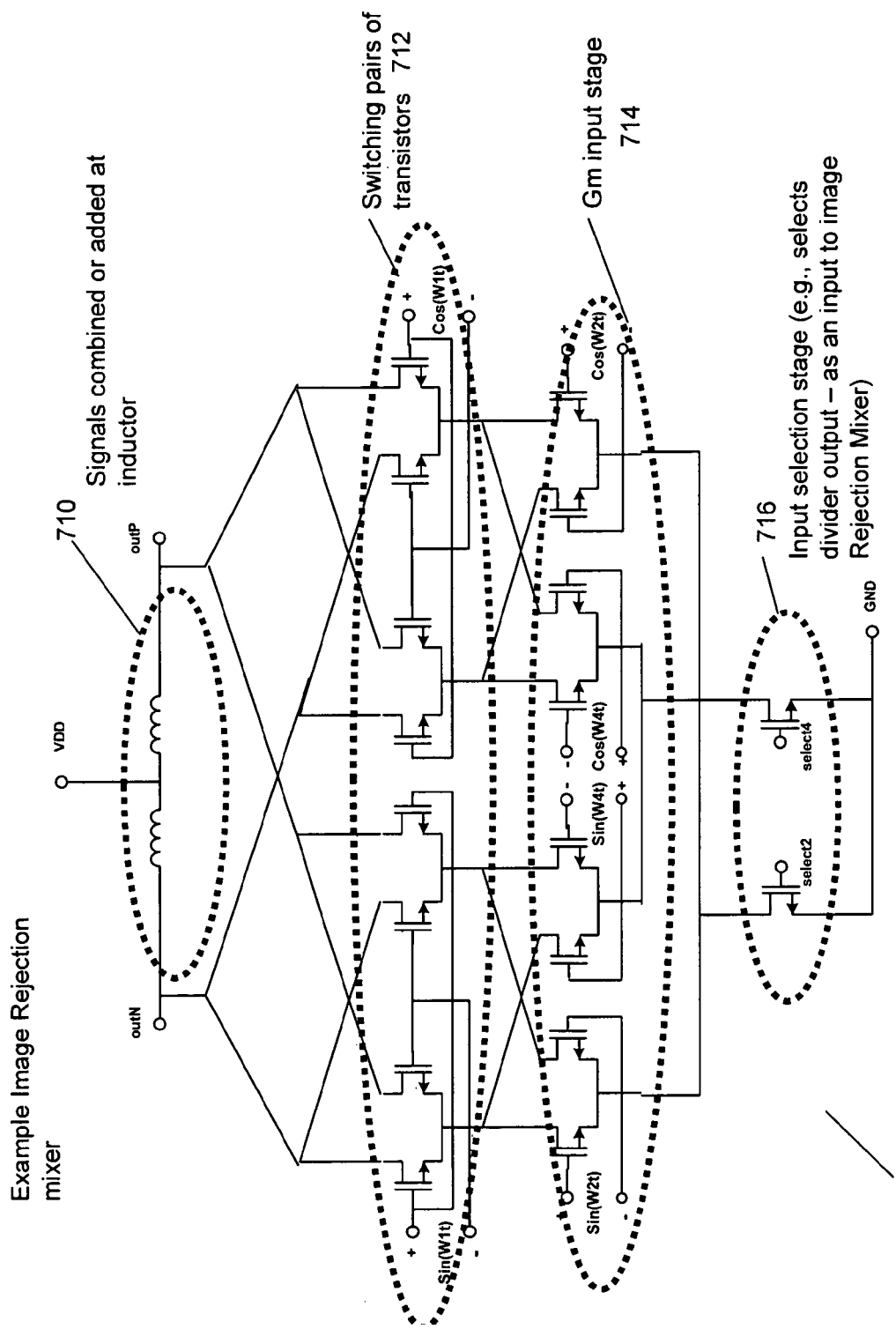
FIG. 7 is a diagram illustrating an image rejection mixer according to an example embodiment.

FIG. 7 is a diagram illustrating an image rejection mixer according to an example embodiment. The example image rejection mixer 700 may include, for example, two mixers having outputs that are combined or added by an adder.

Referring to FIG. 7, an input selection stage 716 may allow the selection of the divider output, e.g., selecting either a divide by 8 output provided via line 235 or a divide by 4 output provided via line 137. The higher divide ratio (e.g., divide by 8) may be selected, for example, when there is interference between signals or transceivers and/or based on the transmission modes that may have been enabled (e.g., if both Bluetooth and WLAN modes are enabled). The selection of the higher divide ratio may output a lower frequency, such as Cos(W2t), while the selection of a lower divide ration may output a higher frequency, such as Cos(W4t). This may be shown in FIG. 7 as select 2 or select 4, for example. On the other hand, the selection of the lower divide ratio, e.g., divide by 4 to select the Cos(W4t) signal may be selected, for example, when there is little or no interference between transceivers or when the enabled modes for the transceiver are not creating substantial interference.

While both frequency outputs are available, only one of these frequency outputs may typically be enabled for mixing in the image rejection mixer. The selection of a divider output may be selected in advance, or may be selected dynamically or on the fly, e.g., changing from the lower divider ratio to the higher divide ration when the Bluetooth transceiver is enabled, due to interference with the WLAN transceiver signals, for example.

Image rejection mixer 700 may also include Gilbert cells or Gilbert mixers, which may include an input stage 714 and switching pairs of transistors 712, in this example embodiment. The Cos(W1t) and Sin(W1t) signals may be provided as outputs from divider 504 (FIG. 5) into switching pairs 712.

The Cos(W2t) and Sin(W2t) may be input to input stage 714 via line 137 (FIG. 5), while the higher frequency signals, Cos(W4t) and Sin(W4t) may be input to input stage 714 via line 235 (FIG. 5), for example. The Cos(W2t) or Cos(W4t), depending on selected divider output, may provide the I or in-phase signal, while Sin(W2t) and Sin(W4t) may provide the Q or quadrature-phase signal. The outputs from the two mixers may be added or combined together at inductor 710, according to an example embodiment.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus provided in a wireless transceiver system, the apparatus comprising:
   a circuit configured to generate a first frequency signal;
   a local oscillator (LO) generator including:
   a first frequency divider configured to generate a second frequency signal;
   a second frequency divider configured to generate a third frequency signal; and
   an image rejection mixer configured to generate an LO signal, the image rejection mixer configured to mix the first frequency signal with the second frequency signal when the wireless transceiver system is configured to operate in a single-band mode in which only a single band transceiver is operable in the wireless transceiver system, and the image rejection mixer being configured to mix the first frequency signal with the third frequency signal when the wireless transceiver system is configured to operate in a multi-band mode in which multiple band transceivers are operable in the wireless transceiver system.

2. The apparatus of claim 1 wherein the circuit configured to generate a first frequency signal comprises a voltage controlled oscillator (VCO) configured to generate a VCO signal.

3. The apparatus of claim 2 wherein the image rejection mixer comprises an image rejection mixer configured to mix the VCO signal with either the second frequency signal or the third frequency signal to generate an LO signal and to substantially reject an unwanted LO image if present.

4. The apparatus of claim 2 wherein the apparatus is provided in a multiband wireless transceiver, further wherein the image rejection mixer comprises:
   an in-phase mixer configured to mix an in-phase VCO signal with an in-phase component of either the second frequency signal or the third frequency signal; and
   a quadrature mixer configured to mix a quadrature VCO signal with a quadrature component of either the second frequency signal or the third frequency signal.

5. A wireless transceiver comprising:
   a multiband wireless transceiver configured to transmit and receive signals within at least one of a first frequency band and a second frequency band;
   a local oscillator (LO) generator to generate an LO signal, the LO generator including an image rejection mixer configured to generate the LO signal based on a first frequency divided output signal if the wireless transceiver is configured to transmit and receive signals within only one of the first and second frequency bands, and wherein the image rejection mixer being configured to generate the LO signal based on a second frequency divided output signal if the wireless transceiver is configured to transmit and receive signals within both of the first and second frequency bands.

6. The apparatus of claim 5 wherein the image rejection mixer comprises:
an input selection stage;
an input stage coupled to the input selection stage; and
one or more switching pairs of transistors coupled to the input stage.

7. The wireless transceiver of claim 5 wherein the multi-band wireless transceiver comprises:
a first wireless transceiver configured to transmit and receive signals within a first frequency band;
a second wireless transceiver configured to transmit and receive signals within a second frequency band that is different from the first frequency band;
and wherein the LO generator comprises a LO generator to generate LO signals for at least the first wireless transceiver, the LO generator including an image rejection mixer configured to generate the LO signal and to substantially reject an unwanted LO image, wherein the first and second wireless transceivers and the LO generator are provided on a common chip.

8. The wireless transceiver of claim 7 wherein the first wireless transceiver further comprises:
a transmit mixer configured to mix the LO signal output from the LO generator with an intermediate frequency (IF) signal to generate a radio frequency (RF) signal for transmission; and
a receive mixer configured to mix the LO signal output from the LO generator with a received RF signal to generate an IF signal.

9. The wireless transceiver of claim 7, wherein the first wireless transceiver is compatible with a first wireless standard, and wherein the second wireless transceiver is compatible with a second wireless standard.

10. The wireless transceiver of claim 9, wherein the first wireless transceiver is compatible with a Bluetooth wireless standard, and wherein the second wireless transceiver is compatible with a wireless LAN (WLAN) standard.

11. The wireless transceiver of claim 9, wherein the first wireless transceiver is compatible with a first wireless LAN (WLAN) standard, and wherein the second wireless transceiver is compatible with a second wireless LAN (WLAN) standard.

12. The wireless transceiver of claim 7 and further comprising a voltage controlled oscillator (VCO) configured to generate a VCO signal.

13. The wireless transceiver of claim 12 and wherein the LO generator comprises:
a frequency divider circuit configured to divide the frequency of the VCO signal to generate the first frequency divided output signal and the second frequency divided output signal, wherein the image rejection mixer is configured to mix the VCO signal with either the first frequency divided output signal or the second frequency divided output signal, depending on whether the wireless transceiver is configured to operate in one of the frequency bands or both of the frequency bands, to generate an LO signal while substantially rejecting an unwanted LO image.

14. A method comprising:
receiving a first frequency signal within a multi-band wireless transceiver;
dividing the first frequency signal to produce a second frequency signal and a third frequency signal;
and
mixing the first frequency signal with a selected one of the second frequency signal or the third frequency signal at an image rejection mixer to generate a local oscillator (LO) signal while substantially rejecting an LO image or sideband, the second frequency signal being selected for mixing with the first frequency signal if the wireless transceiver is configured to transmit and receive signals within only one frequency band, and the third frequency signal being selected for mixing with the first frequency signal if the wireless transceiver is configured to transmit and receive signals within multiple frequency bands.

15. The method of claim 14 wherein the receiving a first signal comprises receiving a VCO signal from a voltage controlled oscillator (VCO).

16. The method of claim 14 and further comprising:
mixing the LO signal at a receive mixer and a transmit mixer for a first wireless transceiver.

17. The method of claim 14 and further comprising:
mixing the LO signal with a received radio frequency (RF) signal at a receive mixer of a first wireless transceiver to generate a first IF signal;
mixing the LO signal with an IF signal of the first wireless transceiver to generate a RF signal for transmission.

* * * * *

UNITED STATES PATENT AND TRADEMARK OFFICE
CERTIFICATE OF CORRECTION

| | | |
|---|---|---|
| PATENT NO. | : 7,894,778 B2 | Page 1 of 1 |
| APPLICATION NO. | : 11/478667 | |
| DATED | : February 22, 2011 | |
| INVENTOR(S) | : Qiang Li | |

It is certified that error appears in the above-identified patent and that said Letters Patent is hereby corrected as shown below:

On first page, in field (56), under "U.S. PATENTS DOCUMENTS", in column 2, line 2, after "Darabi" insert -- et al. --.

Signed and Sealed this
Twenty-fourth Day of May, 2011

David J. Kappos
*Director of the United States Patent and Trademark Office*